United States Patent
Lee et al.

(10) Patent No.: US 7,031,188 B2
(45) Date of Patent: Apr. 18, 2006

(54) MEMORY SYSTEM HAVING FLASH MEMORY WHERE A ONE-TIME PROGRAMMABLE BLOCK IS INCLUDED

(75) Inventors: Chul-Ho Lee, Gyeonggi-do (KR); Hyun-Duk Cho, Gyeonggi-do (KR); Chang-Rae Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/990,307

(22) Filed: Nov. 15, 2004

(65) Prior Publication Data
US 2005/0105331 A1    May 19, 2005

(30) Foreign Application Priority Data
Nov. 13, 2003  (KR) .................. 10-2003-0080301
May 3, 2004    (KR) .................. 10-2004-0031117

(51) Int. Cl.
*G11C 16/04*   (2006.01)

(52) U.S. Cl. ................. 365/185.04; 365/185.01; 365/201

(58) Field of Classification Search ........... 365/185.04, 365/63, 201, 185.01; 714/200
See application file for complete search history.

(56) References Cited

U.S. PATENT DOCUMENTS

| | | | |
|---|---|---|---|
| 5,936,890 A | 8/1999 | Yeom | |
| 6,204,703 B1 | 3/2001 | Kwon | |
| 6,346,834 B1 | 2/2002 | Chai | |
| 6,732,246 B1 * | 5/2004 | Okaue | ............. 711/163 |

FOREIGN PATENT DOCUMENTS

JP    2001-035176    2/2002

OTHER PUBLICATIONS

English language abstract of Japanese Publication No. 2001-035176.

\* cited by examiner

*Primary Examiner*—Son T. Dinh
(74) *Attorney, Agent, or Firm*—Marger Johnson & McCollom, P.C.

(57) ABSTRACT

A memory system includes a flash memory device and an interface device. The flash memory device includes a one-time programmable block where protection data information is stored in a predetermined region, and the interface device includes a register for storing one-time programmable lock status information to indicate whether the one-time programmable block is programmed. When a program/erase command is applied externally in a one-time programmable mode, the interface device having the one-time programmable lock status information indicates whether the one-time programmable block is programmed. If the one-time programmable lock status information indicates that the one-time programmable block is programmed, the interface device cuts off an external access to the one-time programmable block.

39 Claims, 6 Drawing Sheets

MEMORY SYSTEM HAVING FLASH MEMORY WHERE A ONE-TIME PROGRAMMABLE BLOCK IS INCLUDED

This application claims priority from Korean Patent Application No. 2003-80301, filed on Nov. 13, 2003 and Korean Priority Application No. 2004-31117, filed on May 3, 2004, the contents of which are herein incorporated by reference in its entirety.

BACKGROUND OF THE INVENTION

1. Field of this Invention

This disclosure relates to a semiconductor memory device, and more particularly, to a flash memory device including a one-time programmable block (hereinafter, referred to as 'OTP block').

2. Description of Prior Art

Electrically erasable and programmable flash memory devices have been used in various applications. The flash memory device stores data requiring no security (hereinafter, referred to as public data) and includes a memory cell array of EEPROM cells. Recently, as the complexity of information process systems has increased, the users want to store device ID data, such as a serial number of the product company, a manufacture date, security-required data, and the like, in the flash memory device together with the public data. For this, a storage region (hereinafter, referred to as an OTP block) for storing security data is configured into the flash memory device. Like the storage region for storing the public data, the OTP block comprises electrically erasable and programmable cells. To prevent the security data from being damaged or outflowing, the users want to program the security data in the OTP block only one time. However, the flash memory device with the OTP block and the memory system including the same undergo some problems.

1) In the case that a program operation for the OTP block is allowed, data stored in the OTP block may be damaged by a non-permitted user if the program command is known. For example, with the characteristics of the flash memory device, a memory cell in a programmed state is not programmed while a memory cell in an erased state is programmed. Therefore, the important security data stored in the OTP block may be damaged. Once the OTP block is programmed, the program operation for the OTP block should be originally cut off.

2) To identify whether the OTP block is programmed has a difficulty of always accessing (or reading) the OTP block.

3) As well known, the EEPROM cell will be erased so as to allow reprogramming new data in the programmed EEPROM cell. Hence, it is possible to prevent the OTP block from being reprogrammed by limiting the erase operation for the OTP block. A technique for cutting off the erase operation of the OTP block is disclosed in JP laid-open No. 2001-035176. According to the JP laid-open No. 2001-035176, an erase operation for the OTP block is preventable by inserting a fuse in a row decoder that selects the OTP block, and selectively cutting the inserted fuse. However, the technique disclosed in the above patent requires additional fuses and a process for cutting the fuses.

SUMMARY OF THE INVENTION

Figure 1:
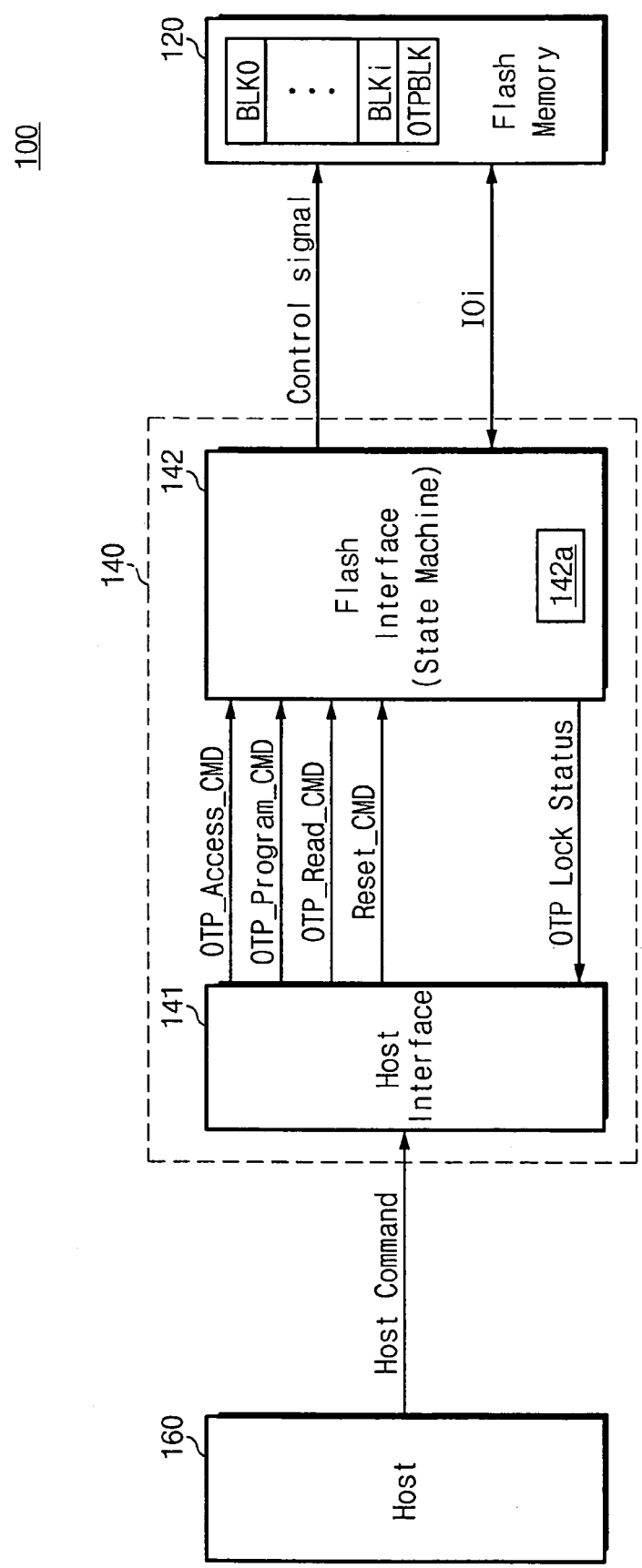
FIG. 1 is a schematic block diagram of a memory system according to a first embodiment of the present invention.

One feature of the present invention is to provide a memory system capable of cutting off erase and reprogram operations of an OTP block.

Another feature of the present invention is to provide a flash memory device and a memory system including the flash memory device, which need not add a fuse for preventing an erase operation of the OTP block.

Still another feature of the present invention is to provide a memory system capable of automatically reading flash memory information without a command from a host at power-up.

According to the features of the present invention, a memory system comprises a flash memory device including a one-time programmable block where protection data information is stored in a predetermined region (hereinafter, referred to as an OTP block) and an interface device including a register for storing OTP lock status information for indicating whether the OTP block is programmed. When an operation command is applied in the OTP mode, the interface device has OTP lock status information indicating whether the OTP block is programmed. When the OTP lock status information indicates that the OTP block is programmed, the interface device cuts off the external access to the OTP block.

In this embodiment, the OTP block comprises a main region and a spare region, and the spare region includes a predetermined region of the OTP block for storing the protection data information.

In this embodiment, the OTP block comprises electrically erasable and programmable memory cells.

In this embodiment, the protection data information is stored in the spare region while the main region is programmed. Alternatively, the protection data information is stored in the spare region after the main region is programmed.

In this embodiment, the register is updated with the protection data information stored in the OTP block at every power-on. In addition, when the protection data information stored in the OTP block is requested externally, the interface device outputs the OTP lock status information stored in the register to an external device without an access to the OTP block. The access to the OTP block includes a program/erase operation of the OTP block.

According to another feature of the present invention, the memory system comprises a flash memory device including an OTP block where the protection data information is stored in a predetermined region and an interface device including a register for storing OTP lock status information for indicating whether the OTP block is programmed. The flash memory device comprises a memory block, a memory block selection circuit for selecting the memory block, an OTP block selection circuit for selecting the OTP block, and a control circuit for setting the memory block selection circuit to an inactive state and the OTP block selection circuit to an active state, respectively, so as to cut off an access to the memory block in the OTP mode.

In this embodiment, when a program/erase command is externally applied in the OTP mode, the interface device has OTP lock status information indicating whether the OTP block is programmed. When the OTP lock status information indicates that the OTP block is programmed, the interface device cuts off an external access to the OTP block. The access to the OTP block includes a program/erase operation of the OTP block. When the OTP lock status information indicates that the OTP block is not programmed, the interface device outputs a command for notifying the memory device of an entry to the OTP mode. The control circuit sets the memory block selection circuit to an inactive state and the OTP block selection circuit to an active state in response to the command, respectively, for notifying an entry to the OTP mode.

In this embodiment, the OTP block comprises a main region and a spare region, and the spare region includes a predetermined region of the OTP block where the protection data information is stored. The OTP block comprises electrically erasable and programmable memory cells.

According to another feature of the present invention, the memory system includes a flash memory device including an OTP block where protection data information is stored in a predetermined region, and an interface device including a register for storing OTP lock status information for indicating whether the OTP block is programmed. The flash memory device further includes a memory block, a memory block selection circuit for selecting the memory block, an OTP block selection circuit for selecting the OTP block, an address buffer circuit for outputting block and row addresses applied from the interface device to the memory block selection circuit and the OTP block selection circuit, and a control circuit for outputting the OTP enable signal in response to the OTP mode. The memory block is not selected by the memory block selection circuit regardless of the block address when the OTP enable signal is activated but the OTP block selection circuit selects the OTP block in response to an activation of the OTP enable signal.

In this embodiment, when a program/erase command is externally applied in the OTP mode, the interface device determines whether the OTP lock status information indicates that the OTP block is programmed. When the OTP lock status information indicates that the OTP block is programmed, the interface device cuts off the external access to the OTP block. The access to the OTP block includes a program/erase operation of the OTP block.

In this embodiment, when the OTP lock status information indicates that the OTP block is not programmed, the interface device generates a command for notifying the flash memory device of the OTP mode, and the control circuit activates the OTP enable signal in response to the command for notifying the OTP mode.

In this embodiment, the OTP block comprises a main region and a spare region, and the spare region includes a predetermined region of the OTP block where the protection data information is stored. The OTP block comprises electrically erasable and programmable memory cells.

In this embodiment, the register is updated with protection data information stored in the OTP block at every power-on. When the protection data information stored in the OTP block is externally requested, the interface device outputs the OTP lock status information to the external without an access to the OTP block.

DETAILED DESCRIPTION OF THE PREFERRED EMBODIMENT

A memory system according to the present invention includes a flash memory device including a one-time programmable block (hereinafter, referred to as an "OTP block"), and an OTP lock status register for storing OTP lock status information. If an external command for programming the OTP block is received after security data is stored in the OTP block, the memory system of the present invention blocks programming of the OTP block in response to protection data information stored in the OTP lock status register. In addition, if an external command for erasing the OTP block is received after the security data is stored in the OTP block, the memory system of the present invention blocks erasing of the OTP block in response to the protection data information stored in the OTP lock status register. This will be fully explained hereinafter. Therefore, the security data is programmed in the OTP block only once for an original purpose, and it may be safely protected regardless of any external operation.

FIG. 1 is a schematic diagram block of a memory system according to a first embodiment of the present invention. Referring to FIG. 1, the memory system 100 of the present invention includes a flash memory device 120, an interface device 140, and a host 160. The flash memory device 120 includes a storage region for storing data, which is comprised of a plurality of memory blocks BLK0-BLKi and at least one OTP block OTPBLK. In the present invention, erase/program/read operations for the memory blocks BLK0-BLKi and a read operation for the OTP block OTPBLK are not limited. Contrary to this, the erase/program operations for the OTP block OTPBLK are limited, which will be fully explained herein. Each of the memory blocks BLK0-BLKi and the OTP block OTPBLK comprises electrically erasable and programmable ROM cells (EEPROMs), each of which has a floating gate transistor.

The interface device 140 serves as an interface between the flash memory device 120 and the host 160. The interface device 140 includes a host interface 141 and a flash interface 142. The host interface 141 receives various instructions (e.g., a program command, an erase command, read command, an OTP command, etc.) from the host 160 to deliver to the flash interface 142. For example, the host interface 141 receives a command for notifying of an OTP mode (hereinafter, referred to as an "OTP command") to generate an OTP access command, OTP access CMD, to the flash interface 142. If the program command is inputted in the OTP mode, the host interface 141 outputs the OTP program command OTP program CMD to the flash interface 142. If a read command is introduced in the OTP mode, the host interface 141 outputs the OTP read command OTP read CMD to the flash interface 142. If a command for escaping the OTP mode is inputted, the host interface 141 outputs a reset command Reset CMD to the flash interface 142.

Continuously referring to FIG. 1, the flash interface 142 includes an OTP lock status register 142a that stores OTP lock status information that indicates whether the OTP block OTPBLK is programmed. For example, the OTP lock status information of '1' indicates that the OTP block OTPBLK of the flash memory device 120 is programmed, and the OTP lock status information of '0' indicates that the OTP block OTPBLK of the flash memory device 120 is not programmed. It is clear to those skilled in the art that the flash interface 142 may be embodied using a state machine well known as a control logic, even if it is not illustrated in the drawing. The flash interface 142 generates control signals for the flash memory device 120 according to commands delivered from the host interface 141. The flash memory device 120 receives commands, addresses and/or data delivered from the flash interface 142 according to a predetermined timing, and this is clear to those skilled in the art.

If the program command is transferred from the host 160 to the interface device 140, the flash interface 142 of the interface device 140 determines whether the OTP lock status information stored in the OTP lock status register 142a indicates '1'. If the OTP lock status information stored in the OTP lock status register 142a is '1', the program command is not transferred to the flash memory device 120. That is, the OTP block OTPBLK of the flash memory device 120 is not programmed. If the OTP lock status information stored in the OTP lock status register 142a indicates '0', the flash interface 142 transfers the program command, the address, and data to the flash memory device 120 at a predetermined timing. That is, desired security data may be programmed in the OTP block OTPBLK of the flash memory device 120 in the well-known method. In addition, if an erase command is delivered to the interface device 140 in the OTP mode, the flash interface 142 determines whether the OTP lock status information stored in the OTP lock status register 142a is '1'. If the OTP lock status information stored in the OTP lock status register 142a is '1', the erase command is not transferred to the flash memory device 120. That is, the OTP block OTPBLK of the flash memory device 120 is not erased. If the OTP lock status information stored in the OTP lock status register 142a is '0', the flash interface 142 delivers the erase command and the address to the flash memory device 120. That is, the OTP block OTPBLK of the flash memory device 120 will be erased in the well-known manner.

When the host 160 requests the OTP lock status information stored in the OTP lock status register 142a from the interface device 140, the interface device 140 may generate the OTP lock status information of the OTP lock status register 142a as protection data information according to the request of the host 160.

Figure 2:
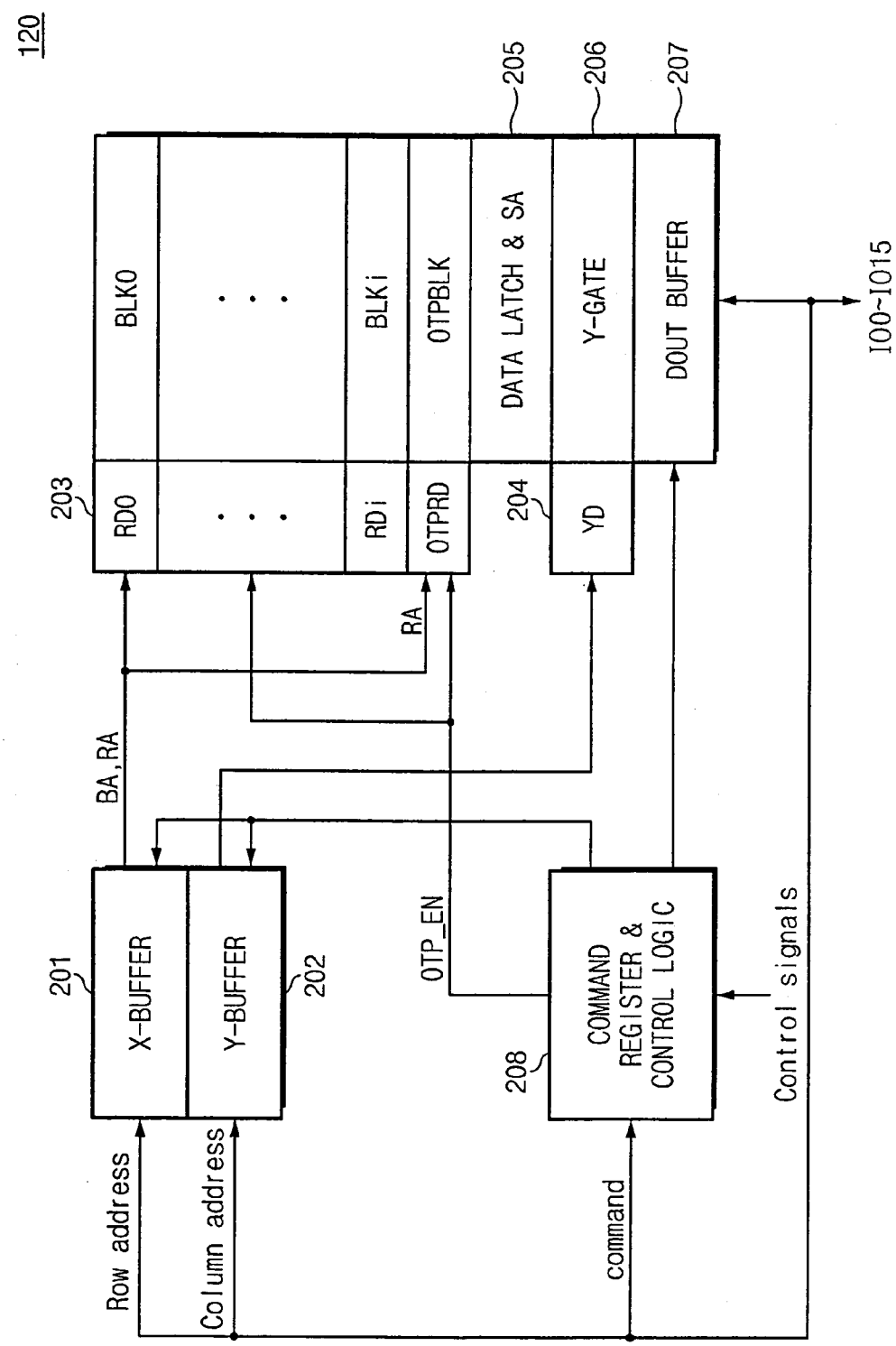
FIG. 2 is a schematic block diagram of a flash memory device illustrated in FIG. 1 according to the present invention.

FIG. 2 is a schematic block diagram of the flash memory device in FIG. 1 in accordance with an exemplary embodiment of the present invention. The flash memory device 120 is a NAND flash memory device. However, it is clear to those skilled in the art that the flash memory device 120 is not confined to the NAND flash memory device.

Referring to FIG. 2, the flash memory device 120 of the present invention includes a memory cell array for storing information. The memory cell array comprises a plurality of memory blocks BLK0-BLKi, and at least one OTP block OTPBLK. Each of the memory blocks BLK0-BLKi and the OTP block OTPBLK has a plurality of strings, each of which the strings may be comprised of a string selection transistor, a ground selection transistor, and memory cell transistors connected in series between the selection transistors, not illustrated in the drawings. Each of the memory cell transistors comprises a floating gate transistor that is electrically erasable and programmable. Protection data information is stored in the OTP block OTPBLK, and the protection data information indicates whether the OTP block OTPBLK is programmed or not. This will be explained more specifically, as follows.

Figure 3:
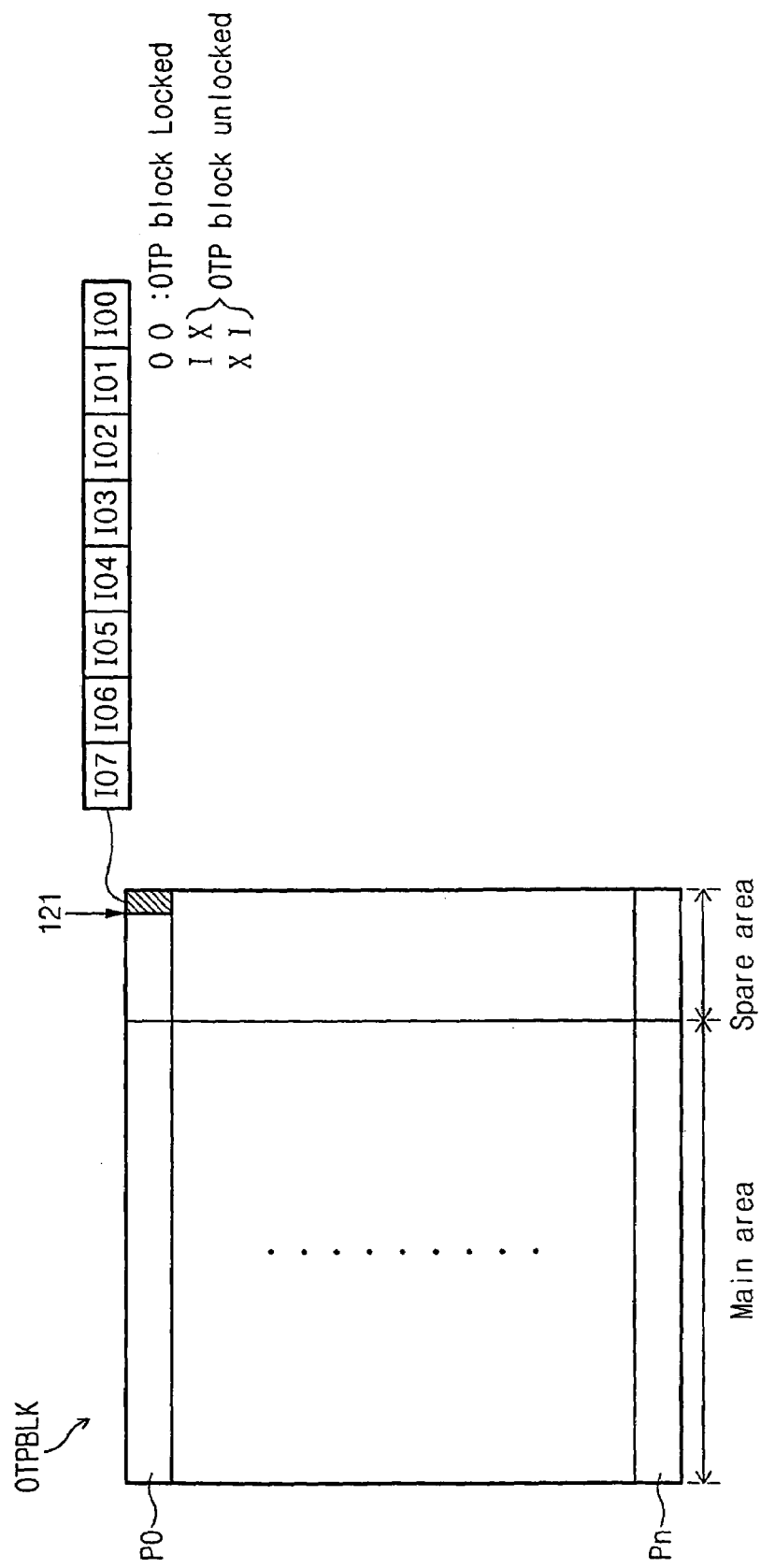
FIG. 3 is a schematic block diagram of an OTP block illustrated in FIG. 2 according to the present invention.

Referring to FIG. 3, schematically illustrating the OTP block, the OTP block OTPBLK includes a main area and a spare area. Security data is stored in the main region, which is comprised of plurality of pages (or word lines). Information related to each page (e.g., ECC information) is stored in the spare region. Here, the protection data information for indicating whether the OTP block OTPBLK is programmed is also stored. The protection data information is stored in a specific region 121 (the shaded region in FIG. 3) of a first page. However, the protection data information may be stored in a spare region of each page or that of an optional page. One word data may be stored in a specific region 121 of the spare region, and two low data bits IO0 and IO1 of the word data are used as the protection data information, as illustrated in FIG. 3. That is, '00' or '1X/X1' data are stored in the two low data bits IO0 and IO1 as protection data information. The protection data information may be stored while the data is stored in a selected page of the main region.

Referring to FIG. 2 again, the flash memory device 120 of the present invention further includes a row buffer circuit 201, a column buffer circuit 202, a row decoder circuit 203, a column decoder circuit 204, a data latch and sense amplify circuit 205, a column gate circuit 206, a data output buffer circuit 207, and a command register and control logic 208.

The row buffer circuit 201 receives a row address inputted through input/output pins IO0-IO15 under the control of a command register and control logic 208, and the column buffer circuit 202 also receives a column address received through the input/output pins IO0-IO15 under the control of the command register and control logic 208. The row decoder circuit 203 selects one of the memory blocks BLK0-BLKi in response to a block address BA outputted from the row buffer circuit 201, and selects one of the word lines/pages of the selected block in response to the row address RA. The row decoder circuit 203 is comprised of row decoders RD0-RDi and OTPRD each corresponding to the memory blocks BLK0-BLKi and the OTP block. The data latch and sense amplify circuit 205 senses and amplifies the data stored in the memory block/OTP block selected during a read operation, and latches data to be stored in the selected memory block/OTP block. The data latch and sense amplify circuit 205 includes a plurality of page buffers each connected to the strings of each memory block/OTP block, not illustrated in the drawing. An exemplary page buffer is disclosed in U.S. Pat. No. 5,936,890, entitled "Semiconductor flash memory having page buffer for verifying programmed memory cells" which is hereby incorporated by reference.

The column decoder circuit 204 generates column selection signals in response to column addresses generated from the column buffer circuit 202. The column gate circuit 206 selects columns (or page buffers) of the selected memory block/OTP block serially in response to the column selection signals from the column decoder circuit 204. The data latched in the selected page buffers is outputted to the external through the input/output pins IO0-IO15 under the control of the command register and control logic 208. The command register and control logic 208 receives a command through the input/output pins IO0-IO15, and controls the internal operation according to the inputted command.

In the case of the present invention, the command register and control logic 208 activates the OTP enable signal OTP_EN when a command for indicating the OTP mode (or an entry to the OTP mode) is inputted. The OTP enable signal OTP_EN is applied to row decoders RD0-RDi each corresponding to the memory blocks BLK0-BLKi and a row decoder OTPRD corresponding to the OTP block OTPBLK.

When the OTP enable signal OTP_EN is activated, the decoders RD0-RDi are inactivated regardless of the block and the row addresses BA and RA from the row buffer circuit 201. That is, when the OTP enable signal OTP_EN is activated, the memory blocks BLK0-BLKi are not selected by the corresponding row decoders RD0-RDi. Contrary to this, when the OTP enable signal OTP_EN is activated, the row decoder OTPRD selects one of the pages/rows of the OTP block OTPBLK in response to the row address RA outputted from the row buffer circuit 201. If the OTP enable signal OTP_EN is activated and then a program/erase/read command is inputted, the operation of program/erase/read of the OTP block OTPBLK may be carried out according to the well-known method of the NAND flash memory device. As a result, the memory blocks BLK0-BLKi are not selected but the OTP block OTPBLK is selected in the OTP mode.

Figure 4:
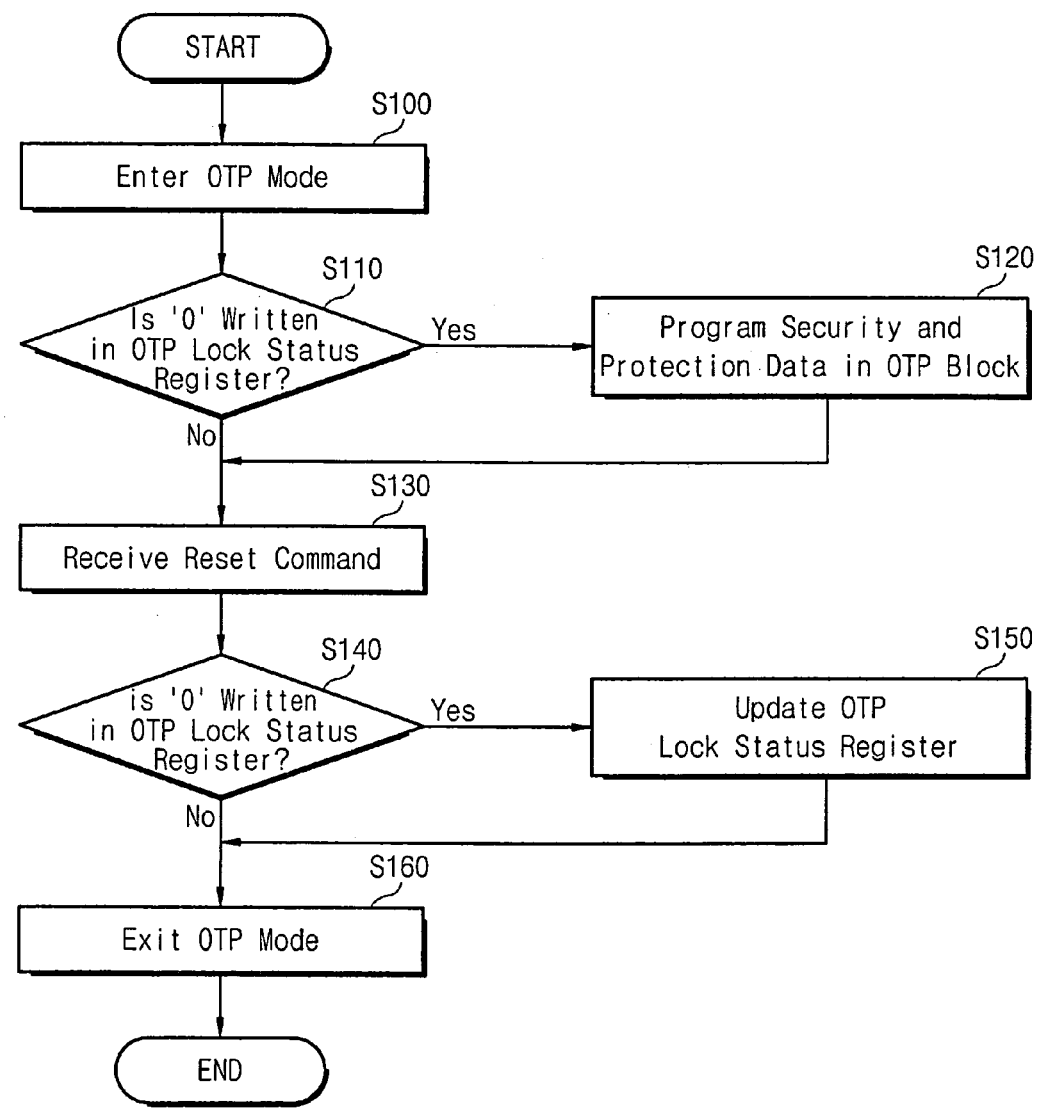
FIG. 4 is a flow chart illustrating an operation of a memory system according to the first embodiment of the present invention.

FIG. 4 is a flow chart illustrating operations of protecting a program and reprogramming of the OTP block in the memory system according to the present invention.

Data may be programmed in the OTP block OTPBLK of the flash memory device 120 only once. In order to program the data in the OTP block OTPBLK of the flash memory device 120, the host 160 outputs a command needed for entering the OTP mode (hereinafter, referred to as "OTP command") to the interface device 140 (step S100). The host interface 141 of the interface device 140 generates an OTP access command in response to the OTP command, and the flash interface 142 outputs the command for notifying an entry to the OTP mode to the flash memory device 120. The command register and control logic 208 of the flash memory device 120 activates the OTP enable signal OTP_EN in response to the command for notifying of an entry to the OTP mode. This makes the memory blocks BLK0-BLKi not selectable according to the inputted block address. That is, as the OTP enable signal OTP_EN is activated in the OTP mode, the memory blocks BLK0-BLKi are not selected but the OTP block OTPBLK is selected.

If the OTP mode is set in the above process, the host 160 outputs the program command to the interface device 140, and the host interface 141 of the interface device 140 outputs the OTP program command to the flash interface 142 in response to the program command. The flash interface 142 determines whether a value of the OTP lock status register 142a is '0', which indicates that the OTP block OTPBLK is not programmed (a step S110). If the value of the OTP lock status register 142a is '1', the process proceeds to a step S130. If the value of the OTP lock status register 142a is '0', security data and protection data are programmed into the OTP block (step S120). Also, if the value of the OTP lock status register 142a is '0', the flash interface 142 generates the program command, the address and the data to the memory device 120 according to a predetermined timing in response to the OTP program command. The command register and control logic 208 of the flash memory device 120 controls a high-voltage generator circuit (not shown) to generate high voltages required for a program operation in response to a program command. The row and column buffer circuits 201 and 202, respectively, latch addresses inputted through the input/output pins IO0-IO15 under the control of the command register and control logic 208.

The row decoder OTPRD corresponding to the OTP block OTPBLK selects one of the pages of the OTP block OTPBLK in response to the row address RA of the addresses inputted in the row buffer circuit 201. In this case, since the row decoders BLK0-BLKi are inactivated by the OTP enable signal OTP_EN, the memory blocks BLK0-BLKi are not selected. The data inputted serially by a unit of a word through the input/output pins IO0-IO15 is loaded on the data latch and sense amplify circuit 205 through the column gate circuit 206. The data to be programmed that is loaded on the data latch and sense amplify circuit 205 is programmed in a main region of the OTP block OTPBLK in the widely known manner. At the same time, protection data information of '00' may be stored in the spare region of the OTP block OTPBLK. Contrary to this, the protection data information of '00' for identifying that the OTP block OTPBLK is programmed may be programmed in the spare region of the OTP block OTPBLK after the spare region of the OTP block OTPBLK is programmed.

If the operation of programming security data and protection data information in the OTP block OTPBLK is ended, the host 160 outputs a reset command to the interface device 140 in order to escape the OTP mode (at step S130). The flash interface 142 determines whether a value of the OTP lock status register 142a is '0', which indicates that the OTP block OTPBLK is not programmed, when a reset command is inputted from the host interface 141 (a step S140). If the value of the OTP lock status register 142a is '1', the process proceeds to a step S160. If the value of the OTP lock status register 142a is '0', the OTP lock status register 142a is updated (a step S150). Specifically, the flash interface 142 outputs a read command to the flash memory device 120 in order to read the protection data information stored in the spare region of the OTP block OTPBLK. The flash interface 142 stores OTP lock status information of '1' in the OTP lock status register 142a when the read protection data information is '00'. That is, the OTP lock status register 142a is updated. Afterward, the flash interface 142 outputs a reset command to the flash memory device 120 and the OTP mode is ended (a step S160). That is, the OTP enable signal OTP_EN is inactivated.

The OTP lock status information stored in the OTP lock status register 142a of the flash interface 142 is lost when the power is cut off, so that the status information should be updated to the OTP lock status register 142a whenever power is applied thereto. More specifically, when the power is turned on, the flash interface 142 sets the flash memory device 120 to the OTP mode in the same manner as explained above, and outputs a read command to the flash memory device 120 so as to read the protection data stored in the spare region of the OTP block OTPBLK. The flash interface 142 stores OTP lock status information of '1' in the OTP lock register 142a when the read protection data information is '00'. That is, the OTP lock status register 142a is updated.

If the OTP block OTPBLK is programmed once, it is impossible to reprogram the OTP block OTPBLK in the OTP mode. More specifically, if the program command is applied to the interface device 140 from the host 160 in the OTP mode, the host interface 141 outputs the OTP program command to the flash interface 142. If the OTP program command is applied to the flash interface 142, the flash interface 142 determines whether the OTP lock status information of '1' is stored in the OTP lock status register 142a. If the OTP lock status information of '1' is stored in the OTP lock status register 142a, the OTP program mode is not determined. Therefore, the OTP block OTPBLK is not reprogrammed. In this case, the interface device 140 may notify the host 160 that an entry of the OTP program mode is failed.

If the OTP block OTPBLK is programmed once, erasing the programmed OTP block is also impossible similar to the reprogram procedure of the OTP block. Specifically, if the erase command from the host 160 is applied to the interface device 140, the host interface 141 generates the OTP erase command to the flash interface 142. If the OTP erase command is applied to the flash interface 142, the flash interface 142 determines whether the OTP lock status information of '1' is stored in the OTP lock status register 142a. If the OTP lock status information of '1' is stored in the OTP lock status register 142a, the OTP erase mode is not set. Therefore, the OTP block OTPBLK is not erased. In this case, the interface device 140 may notify the host that an entry of the OTP mode is failed. As described in the prior art, an additional fuse option is used in the row decoder to prevent an erase operation of the OTP block OTPBLK. However, the present invention may prevent an erase operation of the OTP block OTPBLK without using an additional fuse option (not shown) in the row decoder OTPRD.

In the memory system according to the present invention, to determine whether the OTP block OTPBLK is programmed may be performed without reading protection data information stored in the spare region of the OTP block OTPBLK. For example, when the host requests the protection data information of the OTP block OTPBLK of the interface device 140, the OTP lock status information stored in the OTP lock status register 142a is outputted to the host 160. Therefore, whether the OTP block OTPBLK is programmed may be determined without reading the protection data information stored in the spare region of the OTP block OTPBLK.

As fully illustrated above, controlling an entry to an OTP mode according to OTP lock status information stored in a register can originally prevent reprogram/erase operation of the programmed OTP block. This means that the data stored in the OTP block may be safely preserved. It can be identified whether the OTP block is programmed without a cumbersome access to the OTP block. In addition, the OTP block can be prevented from being erased without an additional fuse option for cutting off the erasing of the OTP block.

Figure 5:
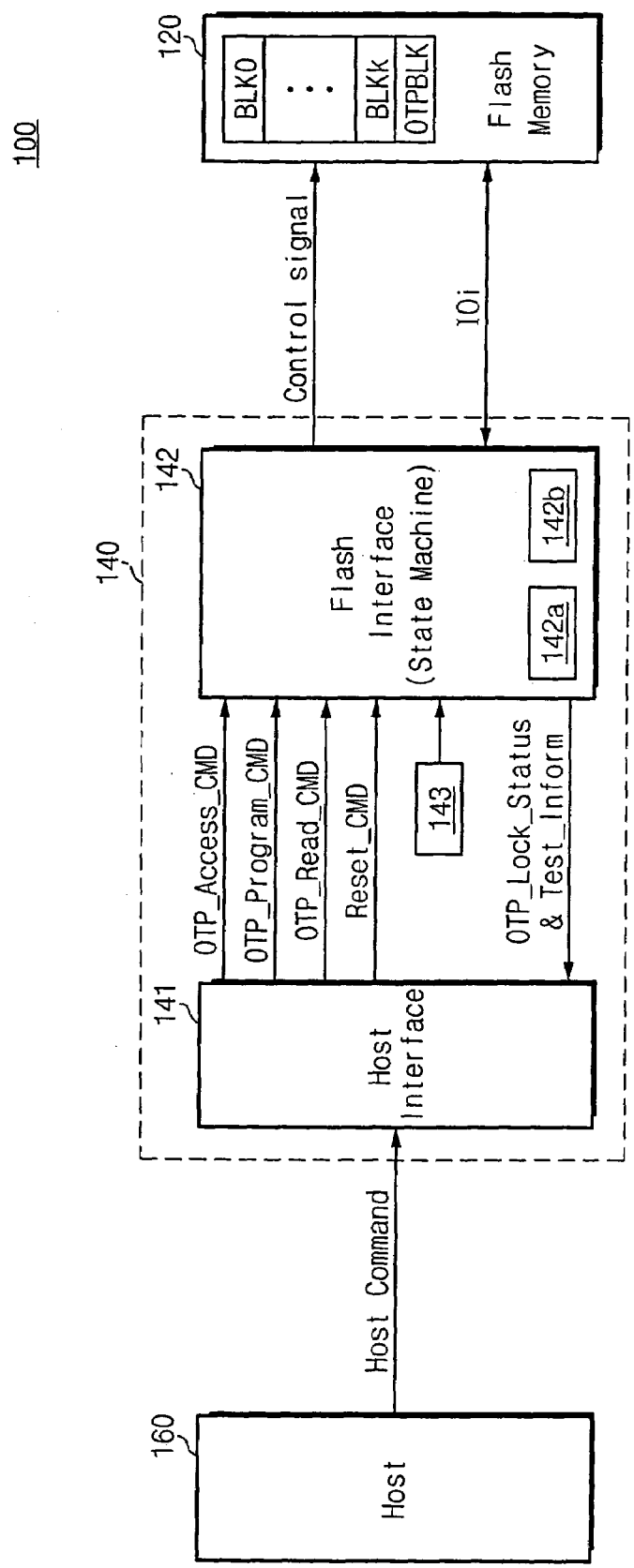
FIG. 5 is a schematic block diagram of a memory system according to a second embodiment of the present invention.

FIG. 5 is a schematic block diagram of a memory system according to a second embodiment of the present invention. In FIG. 5, constituent elements that are identical with those in FIG. 1 are marked by the same numerals, and description thereof is thus omitted.

In the case of a memory system according to the first embodiment of the present invention, as described above, protection data indicating whether an OTP block is programmed is stored in the OTP block together with security data. Furthermore, in the case of the memory system according to the second embodiment of the present invention, test information (e.g., an operating frequency of a flash memory device) obtained at a package level is stored in the OTP block OTPBLK. The test information is stored in any address region of the OTP block (e.g., a main area or a spare region of the OTP block) at a package test level before the security and protection data is stored therein.

Referring to FIG. 5, an interface device 140 includes a host interface 141, a flash interface 142, and a power-on-reset (POR) read enable signal generator circuit 143. The host interface 141 and the flash interface 142 operate the same as those in FIG. 1 in an OTP mode, and description thereof is thus omitted. The POR read enable signal generator circuit 143 generates a POR read enable signal POR_READ at power-up, and the flash interface 142 outputs to a flash memory 120 a command signaling a POR read mode in response to the POR read enable signal POR_READ. Afterward, the flash interface 142 outputs a POR read command and addresses to the flash memory 120. The addresses transferred to the flash memory 120 with the POR read command are addresses designating a region where the test information is stored. The flash memory 120 reads out the test information from the OTP block OTPBLK in response to the POR read command, and outputs the read-out test information to the interface device 140. The flash interface 142 of the interface device 140 stores the test information from the flash memory 120 in a register 142b. When the host 160 requests the interface device 140 for the test information in the register 142b, the interface device 140 outputs the test information in the register 142b to the host 160 via the host interface 141 according to the request of the host 160.

With the above description, in the case of the memory system according to the second embodiment of the present invention, an operation of reading out the test information at power-up is automatically performed under the control of the interface device 140.

In FIG. 5, the individual registers 142a and 142b in the flash interface 142 can be replaced with one register so as to store OTP lock status information and test information, as is obvious in the art.

Figure 6:
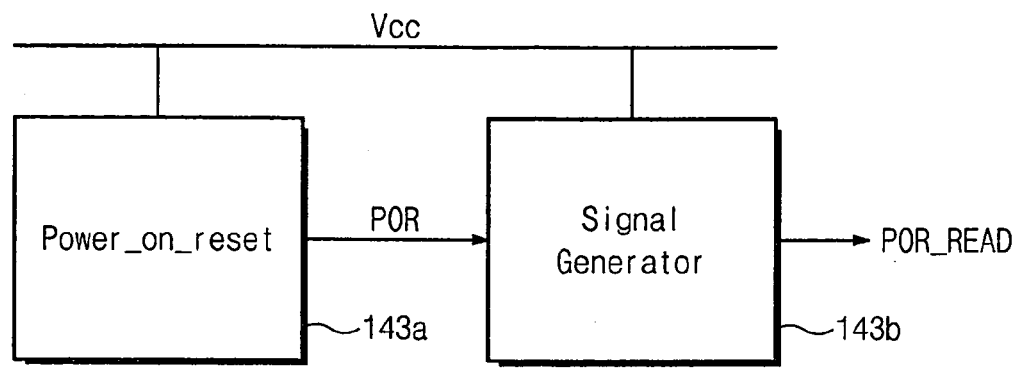
FIG. 6 is a schematic block diagram of a read enable signal generator circuit in FIG. 5 according to one embodiment of the present invention.
Figure 7:
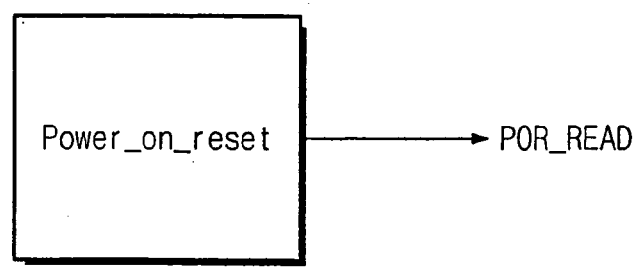
FIG. 7 is a schematic block diagram of a read enable signal generator circuit in FIG. 5 according to other embodiment of the present invention.

FIGS. 6 and 7 are schematic block diagrams of exemplary embodiments of the POR read enable signal generator circuit of FIG. 5.

Referring to FIG. 6, the POR read enable signal generator circuit 143 includes a power-on reset circuit 143a and a signal generator 143b. The power-on reset circuit 143a detects whether a power supply voltage reaches a given voltage at power-up, and generates a power-on reset signal POR as a detection result. The signal generator 143b generates a POR read enable signal POR_READ in response to the power-on reset signal POR. The POR read enable signal POR_READ is generated after the power-on reset signal POR is activated and a given time elapses. Herein, the given time is a time needed for a power supply voltage Vcc to be increased from the given voltage to a target voltage (e.g., a full Vcc). The signal generator 143b, for example, is realized with an oscillator that is well known in the art.

Exemplary power-on reset circuits are disclosed in U.S. Pat. No. 6,346,834 entitled "POWER ON RESET CIRCUIT" and U.S. Pat. No. 6,204,703 entitled "POWER ON RESET CIRCUIT WITH POWER NOISE IMMUNITY", which are herein incorporated by reference.

The POR read enable signal generator circuit 143 can also be realized by the power-on reset circuit illustrated in FIG. 7 and described above.

An operation of a memory system according to the second embodiment of the present invention will be more fully described with reference to FIGS. 2, 5 and 7.

If a power is applied to a memory system 100, the POR read enable signal generator circuit 143 of an interface device 140 generates a POR read enable signal POR_READ. A flash interface 142 outputs a command, indicating a POR read mode, to the flash memory 120 in response to the POR read enable signal POR_READ. A command register and control logic 208 in FIG. 2 activates an OTP enable signal OTP_EN when a POR read command is received in the flash memory 120. The OTP enable signal OTP_EN is commonly applied to row decoders RD0-RDi each corresponding to memory blocks BLK0-BLKi and a row decoder OTPRD corresponding to an OTP block OTPBLK. When the OTP enable signal OTP_EN is activated, the decoders RD0-RDi are inactivated regardless of block and row addresses BA and RA that will be received next. That is, when the OTP enable signal OTP_EN is activated, the memory blocks BLK0-BLKi are not selected by corresponding row decoders RD0-RDi. On the other hand, although the OTP enable signal OTP_EN is activated, the row decoder OTPRD will select one of the pages/word lines in the OTP block OTPBLK in response to a row address RA from a row buffer circuit 201.

The flash interface 142 outputs addresses with a POR read command to the flash memory 120 following the command indicating the POR read mode. If the POR read command is applied to the flash memory 120 after activation of the OTP enable signal OTP_EN, a read operation for the OTP block OTPBLK is carried out in the well-known manner of the flash memory device. The detailed description is as follows.

A row buffer circuit 201 in FIG. 2 receives a row address via input/output pins IO0-IO15 under the control of the command register and control logic 208, and a column buffer circuit receives a column address via the input/output pins IO0-IO15 under the control of the command register and control logic 208. A row decoder OTPRD selects one of the word lines/pages of the OTP block OTPBLK in response to an address from the row buffer circuit 201. A data latch and sense amplifier circuit 205 senses and latches data (that is, test data information) stored in the selected OTP block. A column decoder circuit 204 generates column selection signals in response to a column address from the column buffer circuit 202, and a column gate circuit 206 selects columns (or page buffers) of the selected OTP block sequentially by a word unit in response to the column selection signals from the column decoder circuit 204. Data in the selected page buffers is outputted to the external via the input/output pins IO0-IO15 under the control of the command register and control logic 208. As a result, the test information is stored in a register 142b of the flash interface 142b. When the host 160 requests the interface device 140 for the test information in the register 142b, the interface device 140 outputs the test information in the register 142b via the host interface 141 according to the request of the host 160.

As a result, in the case of the memory system according to the second embodiment of the present invention, an operation of reading test information from the OTP block at power-up is automatically carried out under the control of the interface device 140 without a command from the host 160.

In the case of the memory system according to the second embodiment of the present invention, it is possible to improve a yield by storing test information such as an operating frequency of the flash memory in the OTP block. For example, although a number of chips are fabricated on a wafer under the same condition, there exist chips that don't belong to a desired operating frequency range. In general, a test operation (e.g., an operation of testing an operating frequency of each chip) of the chips is carried out at a package level. If a measured operating frequency of any chip does not belong to the desired operating frequency range (or if an operating frequency of a manufactured chip does not belong to a desired operating frequency range), such a chip is discarded. But, in the case of the present invention, test information of the measured operating frequency is stored in the OTP block. If an operating frequency of a manufactured chip does not belong to a desired operating frequency range, such a chip need not be discarded, but instead can be classified as a chip belonging to another operating frequency range on the basis of the above-described test information. This means that a yield is improved.

In the case of the memory system according to the second embodiment, the test information is read out after the POR read mode is set. On the other hand, the POR read operation can be carried out directly after the POR read enable signal is activated. For example, the flash interface 142 outputs an address, which is an address designating a region where test information is stored, with a POR read command to the flash memory 120 in response to activation of a POR read enable signal POR_READ. And then, the flash memory 120 activates the OTP enable signal OTP_EN in response to the POR read command. This means that the row decoder OTPRD is activated. Afterward, as described above, a read operation is performed to read out test information from the OTP block, and the test information thus read is stored in the register 142b of the flash interface 142.

With design modification, protection data information and test information in the OTP block can be read out sequentially in an OTP mode and a POR read mode, respectively. Alternatively, the protection data information and the test information can be read out in the POR read mode at the same time or individually, or in the OTP mode at the same time or individually.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure the invention.

While the invention has been disclosed in its preferred embodiments, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and sub-combinations of the various elements, features, functions and/or properties disclosed herein.

The following claims define certain combinations and sub-combinations, which are regarded as novel and non-obvious. Additional claims for other combinations and sub-combinations of features, functions, elements and/or properties may be presented in this or a related document.

We claim:

1. A memory system, comprising:
a flash memory device including a one-time programmable block where protection data information is stored in a predetermined region; and
an interface device including a register to store one-time programmable lock status information that indicates whether the one-time programmable block is programmed, wherein when an operation command is applied in a one-time programmable mode, the interface device determines whether the one-time programmable lock status information is programmed in the one-time programmable block, and
wherein when the one-time programmable lock status information indicates that the one-time programmable block is programmed, the interface device cuts off an external access to the one-time programmable block.

2. The memory system of claim 1, wherein the one-time programmable block includes a main region and a spare region, wherein the spare region includes the predetermined region of the one-time programmable block where the protection data information is stored.

3. The memory system of claim 1, wherein the one-time programmable block includes electrically erasable and programmable memory cells.

4. The memory system of claim 2, wherein the protection data information is stored in the spare region while the main region is programmed.

5. The memory system of claim 2, wherein the protection data information is stored in the spare region after the main region is programmed.

6. The memory system of claim 1, wherein the register is updated with the protection data information stored in the one-time programmable block at every power-on.

7. The memory system of claim 1, wherein when the protection data information stored in the one-time programmable block is externally requested, the interface device outputs the one-time programmable lock status information stored in the register to an external device without the external access to the one-time programmable block.

8. The memory system of claim 1, wherein the external access to the one-time programmable block includes a program/erase operation of the one-time programmable block.

9. The memory system of claim 1, wherein the interface device further includes a power-on reset read enable signal generator circuit to generate a power-on reset read enable signal at power-up.

10. The memory system of claim 1, wherein test information is programmed into the one-time programmable block at a package level.

11. The memory system of claim 10, wherein the interface device controls the flash memory device so that the test information in the one-time programmable block is read out when the power-on reset read enable signal is activated.

12. The memory system of claim 10, wherein the test information read out from the flash memory device is stored in a second register every power-up.

13. A memory system, comprising:
a flash memory device including a one-time programmable block where protection data information is stored in a predetermined region; and
an interface device including a register to store one-time programmable lock status information that indicates whether the one-time programmable block is programmed, wherein the flash memory device comprises:
a memory block;
a memory block selection circuit for selecting the memory block;
a one-time programmable block selection circuit for selecting the one-time programmable block; and
a control circuit for setting the memory block selection circuit to an inactive state and the one-time programmable block selection circuit to an active state, respectively, so as to cut off an access to the memory block in a one-time programmable mode.

14. The memory system of claim 13, wherein when the program/erase command is applied externally in the one-time programmable mode, the interface device having the one-time programmable lock status information indicates whether the one-time programmable block is programmed.

15. The memory system of claim 14, wherein when the one-time programmable lock status information indicates that the one-time programmable block is programmed, the interface device cuts off an external access to the one-time programmable block.

16. The memory system of claim 15, wherein the external access to the one-time programmable block includes a program/erase operation.

17. The memory system of claim 14, wherein when the one-time programmable lock status information indicates that the one-time programmable block is not programmed, the interface device generates a command for notifying the flash memory device to enter the one-time programmable mode, and wherein the control circuit sets the memory block selection circuit to the inactive state and the one-time programmable block selection circuit to the active state in response to the command for notifying the flash memory device to enter the one-time programmable mode.

18. The memory system of claim 13, wherein the one-time programmable block includes a main region and a spare region, wherein the spare region includes a predetermined region of the one-time programmable block where the protection data information is stored.

19. The memory system of claim 13, wherein the one-time programmable block includes electrically erasable and programmable memory cells.

20. The memory system of claim 18, wherein the protection data information is stored in the spare region while the main region is programmed.

21. The memory system of claim 18, wherein the protection data information is stored in the spare region after the main region is programmed.

22. The memory system of claim 13, wherein the register is updated with the protection data information stored in the one-time programmable block at every power-on.

23. The memory system of claim 13, wherein when the protection data information stored in the one-time programmable block is externally requested, the interface device outputs the one-time programmable lock status information stored in the register to an external device without an external access to the one-time programmable block.

24. A memory system, comprising:
a flash memory device including a one-time programmable block where the protection data information is stored in a predetermined region; and
an interface device including a register to store one-time programmable lock status information that indicates whether the one-time programmable block is programmed, wherein the flash memory device further comprises:
a memory block;
a memory block selection circuit for selecting the memory block;
a one-time programmable block selection circuit for selecting the one-time programmable block;
an address buffer circuit to output block addresses and row addresses applied from the interface device to the memory block selection circuit and the one-time programmable block selection circuit; and
a control circuit to generate a one-time programmable enable signal in response to a command to notify of a one-time programmable mode, wherein the memory block is not selected by the memory block selection circuit regardless of the block addresses when the one-time programmable enable signal is activated, and the one-time programmable block selection circuit selects the one-time programmable block in response to an activated one-time programmable enable signal.

25. The memory system of claim 24, wherein when a program/erase command is applied externally in the one-time programmable mode, the interface device having the one-time programmable lock status information indicates whether the one-time programmable block is programmed.

26. The memory system of claim 24, wherein when the one-time programmable lock status information indicates that the one-time programmable block is programmed, the interface device cuts off an external access to the one-time programmable block.

27. The memory system of claim 26, wherein the external access to the one-time programmable block includes a program/erase operation.

28. The memory system of claim 25, wherein when the one-time programmable lock status information indicates the one-time programmable block is not programmed, the interface device outputs a command for notifying the flash memory device to enter the one-time programmable mode, and the control circuit activates the one-time programmable enable signal in response to the command to notify of the one-time programmable mode.

29. The memory system of claim 28, wherein the one-time programmable block includes a main region and a spare region, wherein the spare region includes a predetermined region of the one-time programmable block where the protection data information is stored.

30. The memory system of claim 24, wherein the one-time programmable block includes electrically erasable and programmable memory cells.

31. The memory system of claim 24, wherein the register is updated with the protection data information stored in the one-time programmable block at every power-on.

32. The memory system of claim 24, wherein when the protection data information stored in the one-time programmable block is externally requested, the interface device outputs the one-time programmable lock status information stored in the register without an external access to the one-time programmable block.

33. A memory system comprising:
  a flash memory device including a one-time programmable block where test information is stored;
  a power-on reset read enable signal generator circuit to generate a power-on reset read enable signal at power-up; and
  an interface device control an access to the flash memory device in response to the power-on reset read enable signal so that the test information in the one-time programmable block is accessed without an external command at power-up.

34. The memory system of claim 33, wherein the one-time programmable block comprises electrically erasable and programmable memory cells.

35. The memory system of claim 33, wherein the test information includes an operating frequency of the flash memory device obtained at a package level, the test information being stored in the one-time programmable block at the package level.

36. The memory system of claim 33, wherein the interface device comprises a register which is updated with the test information stored in the one-time programmable block every power-up.

37. The memory system of claim 36, wherein when the test information in the one-time programmable block is requested from the external, the interface device outputs the test information to the external without accessing the one-time programmable block.

38. The memory system of claim 33, wherein the power-on reset read enable signal generator circuit comprises a power-on reset circuit for generating the power-on reset read enable signal when a power supply voltage reaches a predetermined voltage at the power-up.

39. The memory system of claim 33, wherein the power-on reset read enable signal generator circuit comprises:
  a power-on reset circuit for generating a power-on reset signal when a power supply voltage reaches a predetermined voltage at the power-up; and
  an oscillator for generating the power-on reset read enable signal after the power-on reset signal is activated and a time elapses.

* * * * *